United States Patent [19]
Rydel

[11] Patent Number: 5,191,324
[45] Date of Patent: Mar. 2, 1993

[54] REMOTE CONTROL SYSTEM FOR LOCKING/UNLOCKING THE DOORS OF MOTOR VEHICLES WITH ASPHERICAL TOROIDAL LENS CONTAINING MULTIPLE PHOTODETECTORS

[75] Inventor: Charles Rydel, Paris, France

[73] Assignee: Valeo Neiman, Croissy-sur-Seine, France

[21] Appl. No.: 650,756

[22] Filed: Feb. 5, 1991

[30] Foreign Application Priority Data

Feb. 9, 1990 [FR] France .................. 90 01541

[51] Int. Cl.⁵ .......... G08C 23/00; G02B 3/06; B60R 25/00
[52] U.S. Cl. .................. 340/825.72; 180/287; 250/216; 250/239; 359/142; 359/154; 359/193; 359/711
[58] Field of Search .......... 340/825.72, 825.69, 340/426; 180/287; 250/201.9, 203.2, 216, 221, 235, 239, 215, 552; 359/180, 193, 142, 146, 154, 710, 711, 718, 19; 358/194.1; 357/19; 235/472, 454; 455/352

[56] References Cited

U.S. PATENT DOCUMENTS

| | | | |
|---|---|---|---|
| 3,580,663 | 5/1971 | Hicks | 359/718 |
| 3,784,794 | 1/1974 | Allais | 235/472 |
| 4,042,821 | 8/1977 | Mierzwinski | 359/710 |
| 4,691,801 | 9/1987 | Mann et al. | 180/287 |
| 4,905,216 | 2/1990 | Lee | 359/19 |
| 5,033,113 | 7/1991 | Wang | 359/142 |
| 5,036,188 | 7/1991 | Keitoku | 250/216 |

FOREIGN PATENT DOCUMENTS

| | | |
|---|---|---|
| 2440168 | 3/1976 | Fed. Rep. of Germany . |
| 3803541 | 8/1989 | Fed. Rep. of Germany . |
| 2-171044 | 7/1990 | Japan ................. 359/193 |

OTHER PUBLICATIONS

IBM Technical Disclosure Bulletin, vol. 29, No. 2, juillet 1986, pp. 802–805, New York, US; "Optical dispersion plat".

Patent Abstracts of Japan, vol. 5, No. 176 (E-81) [848], Nov. 12, 1981; & JP-A-56 103 481 (Fuji Shasin Film K.K.).

Patent Abstracts of Japan, vol. 13, No. 499 (P-957) [3847], Nov. 10, 1989; & JP-A-1 200 221 (Minolta Camera Co., Ltd.) Nov. 8, 1989.

*Primary Examiner*—Donald J. Yusko
*Assistant Examiner*—John Giust

[57] ABSTRACT

A remote control system, in particular for locking and unlocking the doors of a motor vehicle, the system being of the type comprising a portable transmitter including means constituting a light source suitable for generating an encoded light flux, and a fixed receiver including photosensitive means designed to receive the light flux and associated with treatment means designed to decode it, wherein the photosensitive means of the receiver comprise a lens having a toroidal aspherical outside surface, which lens is associated with a plurality of photocells.

10 Claims, 7 Drawing Sheets

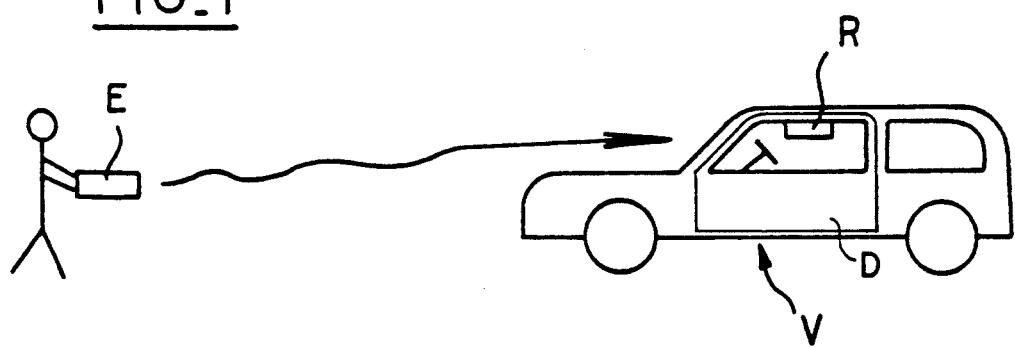
FIG_1
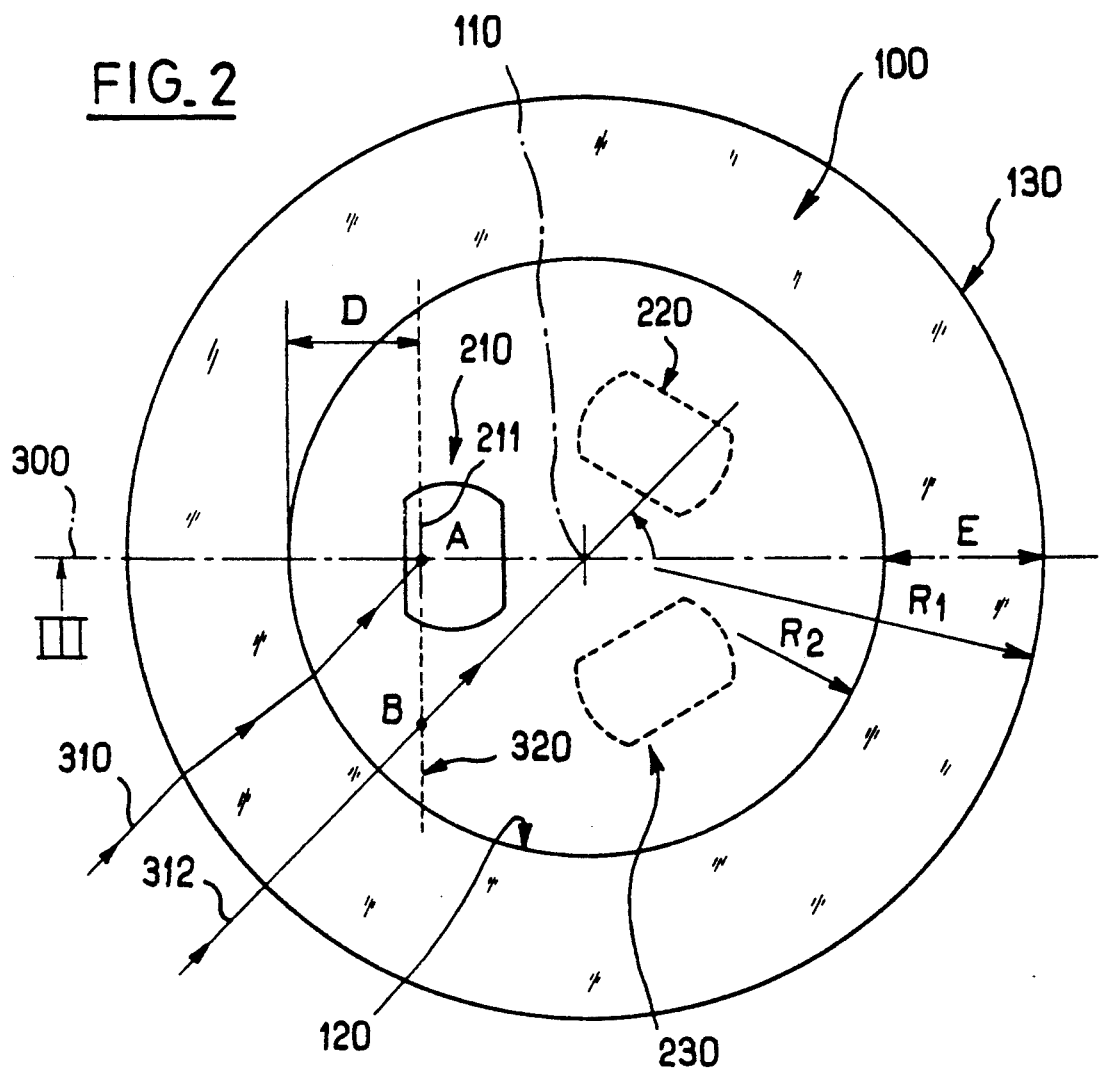
FIG_2

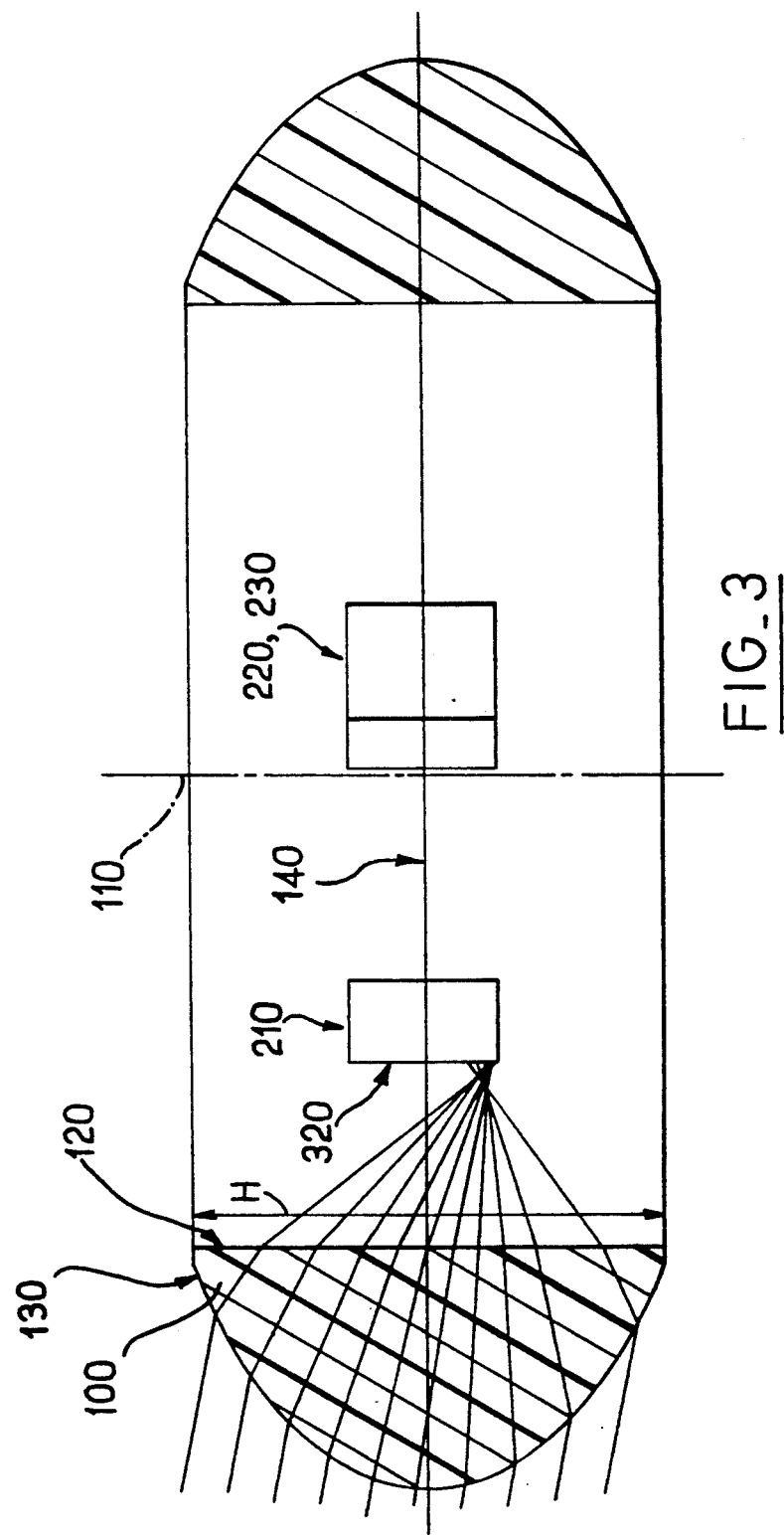

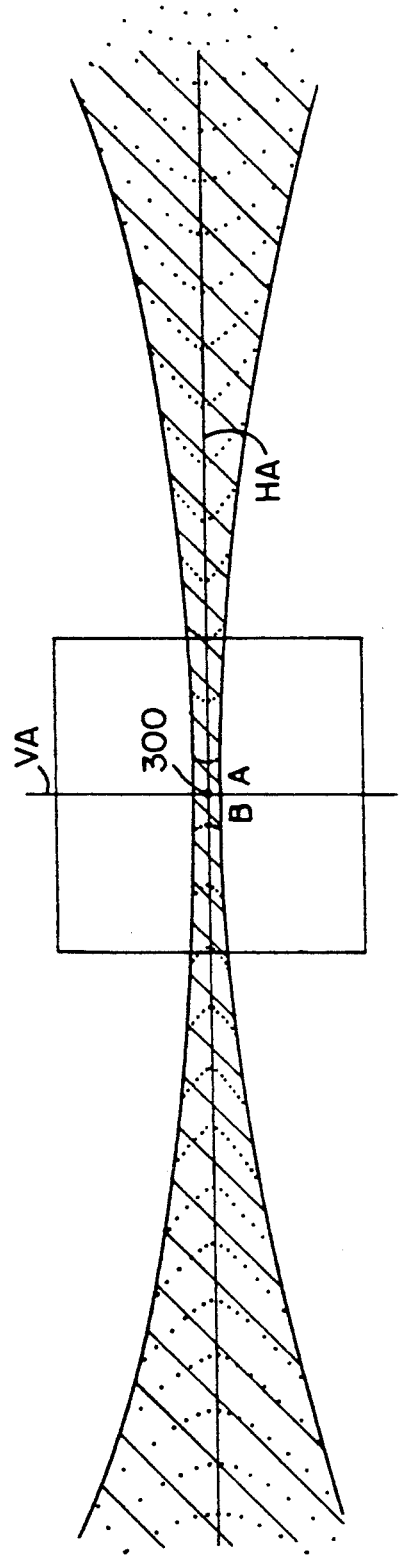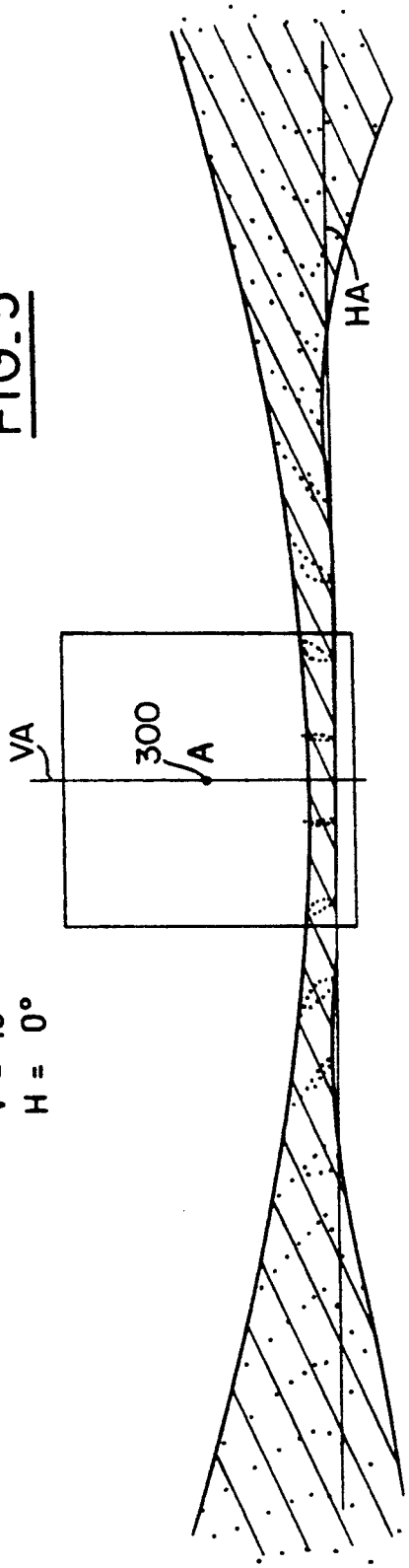

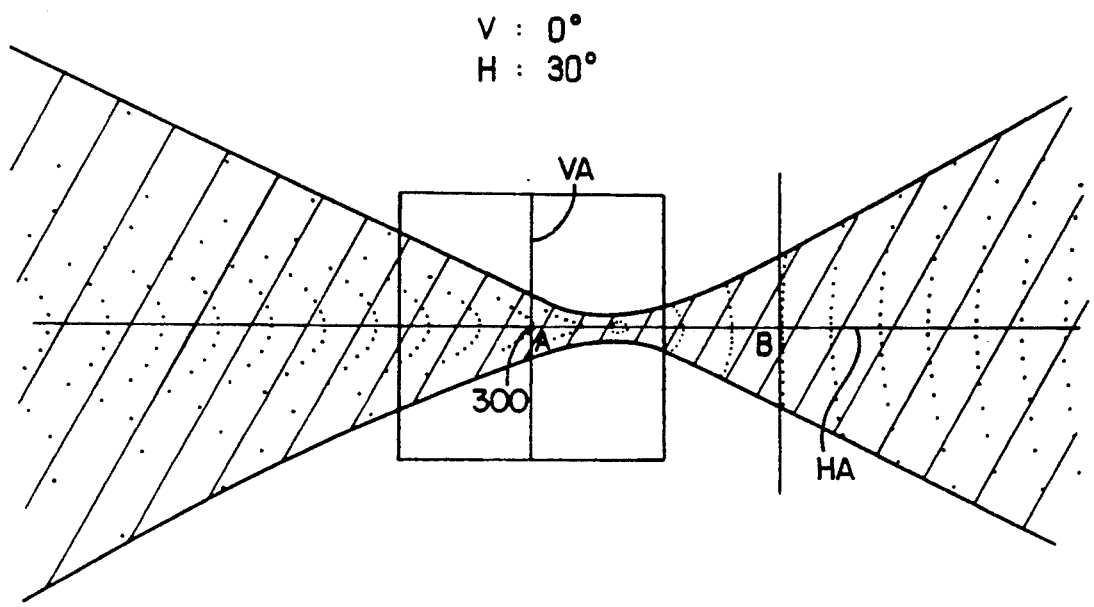
FIG_6
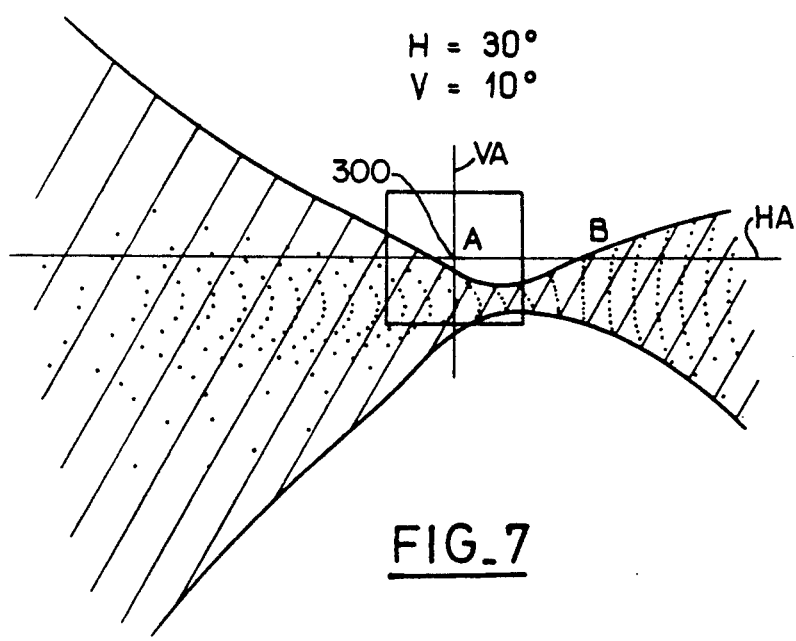
FIG_7

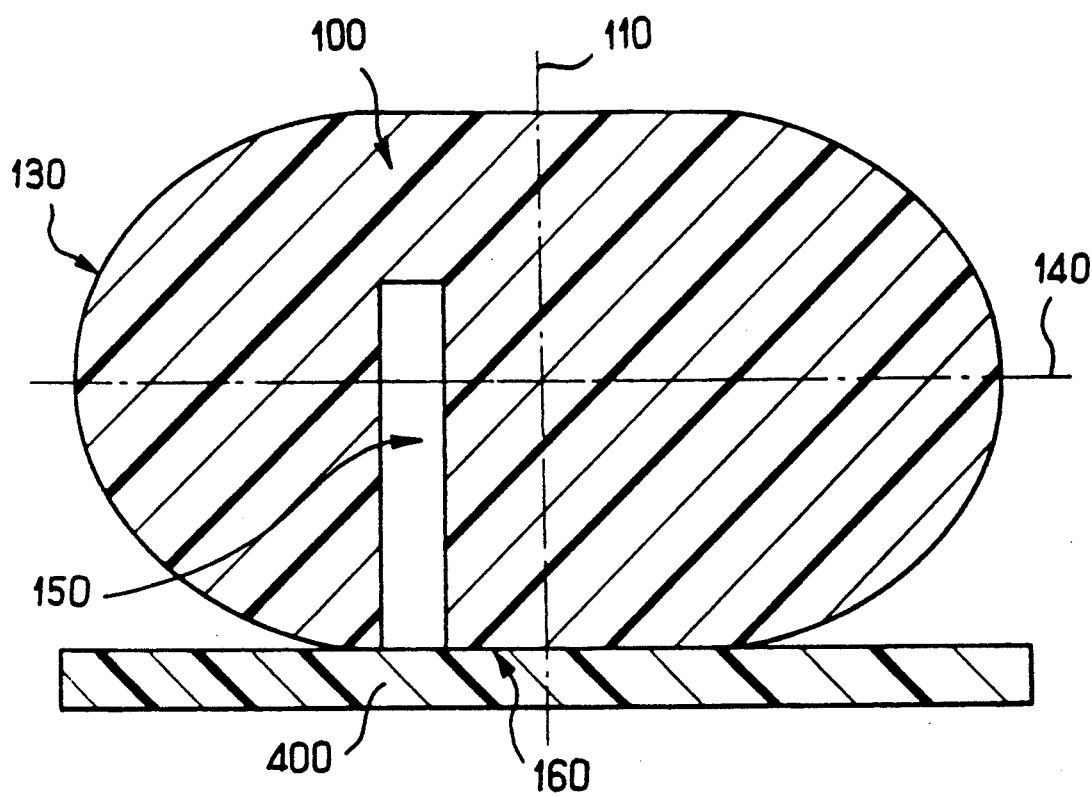
FIG_10
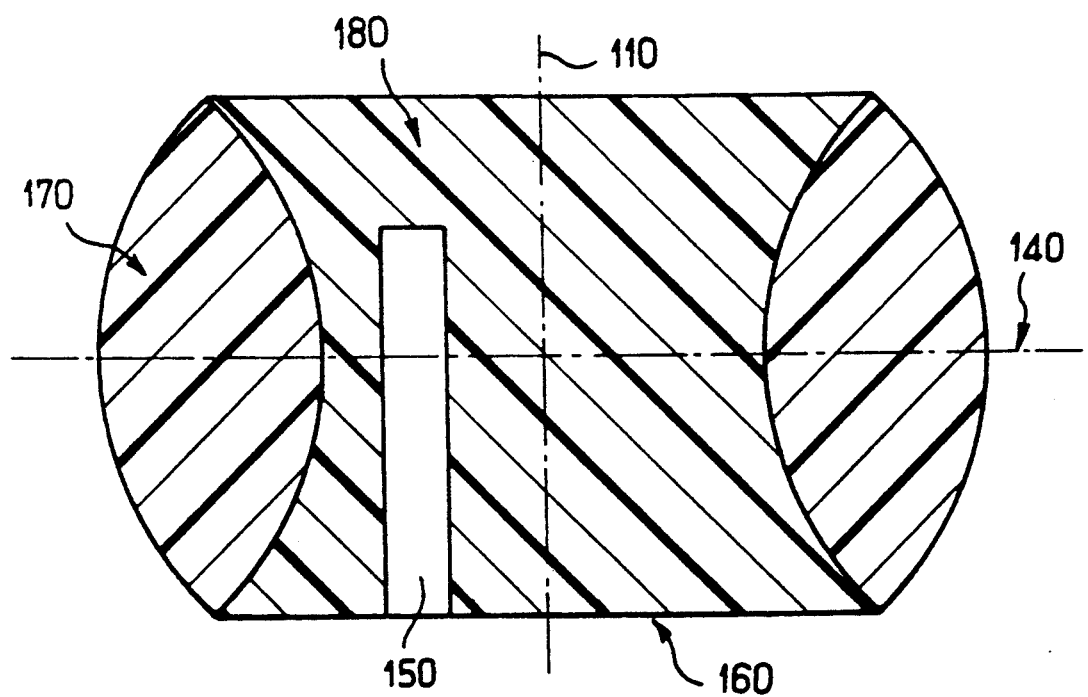
FIG_11

REMOTE CONTROL SYSTEM FOR LOCKING/UNLOCKING THE DOORS OF MOTOR VEHICLES WITH ASPHERICAL TOROIDAL LENS CONTAINING MULTIPLE PHOTODETECTORS

The present invention relates to remote control systems, in particular via an infrared link.

The present invention applies most particularly to remote control systems for locking and unlocking the doors of motor vehicles.

BACKGROUND OF THE INVENTION

Prior remote control systems generally comprise a portable transmitter including means for forming a light source capable of generating an encoded light flux, and a fixed receiver including photosensitive means designed to receive the above-mentioned light flux and associated with processor means designed to decode it.

A main object of the present invention is to provide novel means enabling the receiver to be improved by enabling it to detect encoded light flux over 360°, i.e. substantially regardless of the direction of incidence of the light flux.

SUMMARY OF THE INVENTION

In a remote control system, the photosensitive means of the receiver comprise a lens having a toroidal aspherical outside surface, which lens is associated with a plurality of photocells.

BRIEF DESCRIPTION OF THE DRAWINGS

Embodiments of the invention are described by way of example with reference to the accompanying drawings in which:

FIG. 1 is a diagram showing a remote control system in accordance with the present invention for locking and unlocking the doors of a motor vehicle;

FIG. 2 is a diagrammatic plan of photosensitive means in accordance with the present invention;

FIG. 3 is a fragmentary view in vertical section showing an aspherical toroidal lens in accordance with the present invention as illustrated by sectional vertical plan referenced III in FIG. 2.

FIGS. 4, 5, 6, 7, 8, and 9 are six spot diagrams illustrating light flux received by the photosensitive cells at various horizontal and vertical angles of incidence; and FIGS. 10 and 11 are diagrammatic vertical sections through two other variant embodiments of the toroidal aspherical lens of the present invention.

DETAILED DESCRIPTION

Accompanying FIG. 1 is a diagram showing a remote control system of the present invention designed to lock and unlock the doors D of a motor vehicle V from a distance. The system comprises a transmitter E and a receiver R.

The transmitter E is placed in a portable box. It is designed to generate an encoded electromagnetic wave, generally in the infrared region of the spectrum.

The receiver R is placed inside the vehicle V. It is designed to receive and decode the signal generated by the transmitter E.

When the signal received by the receiver R corresponds to a predetermined code, the receiver R causes the doors of the motor vehicle to be locked or unlocked as appropriate.

Numerous transmitter and receiver systems have already been proposed for this purpose.

For this reason the structure of the transmitter E and of the receiver R is not described in detail below.

In the context of the present patent application, it suffices to describe the photosensitive means of the invention as integrated in the receiver R.

In outline, these photosensitive means comprise a toroidal aspherical lens 100 associated with a plurality of photosensitive cells 210, 220, and 230.

The lens 100 has an axis of symmetry 110 which is vertical in use.

Figure 2A:
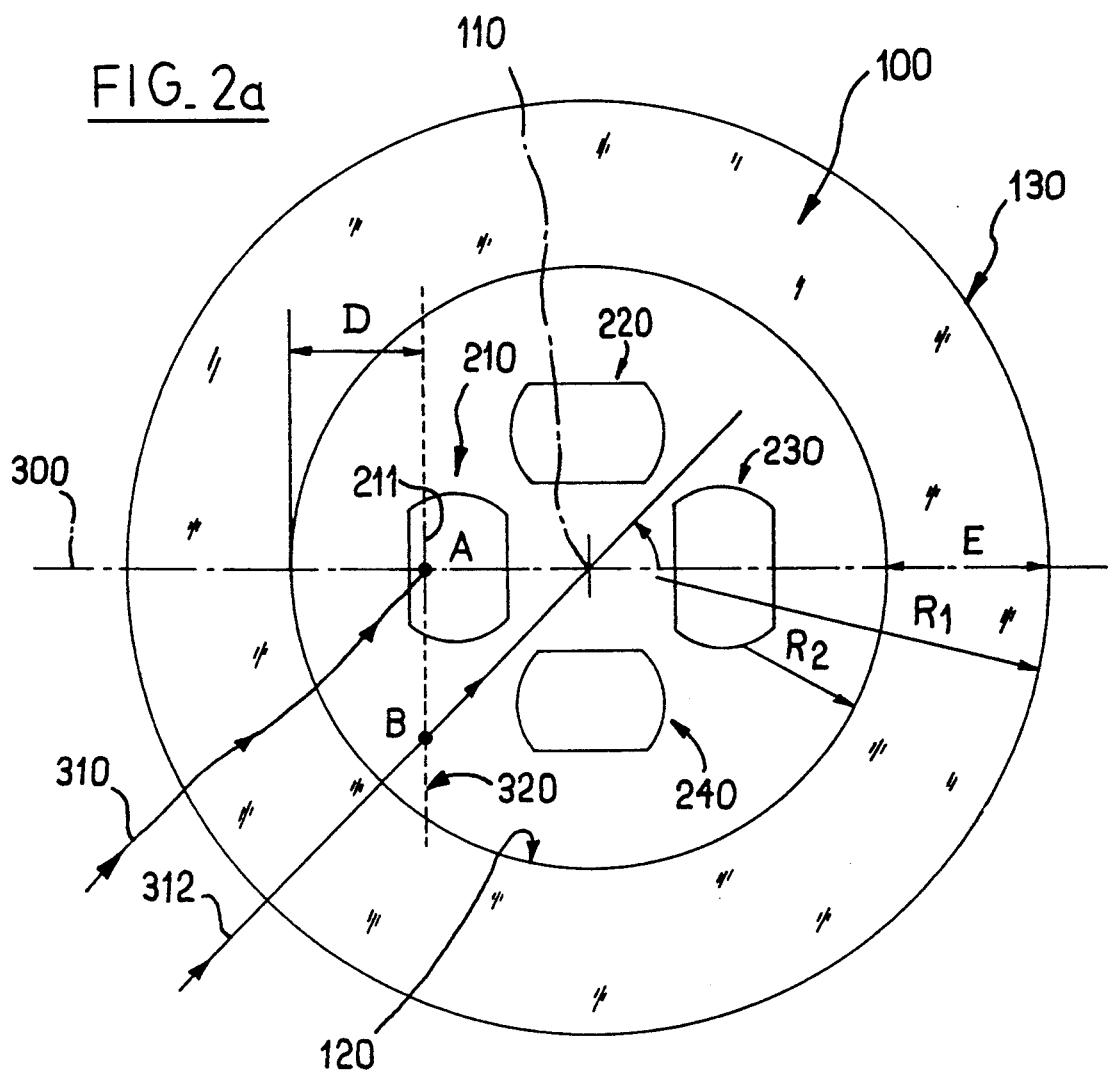
FIG. 2a is a diagrammatic plan of photosensitive means in accordance with a variant of the present invention.
Figure 3A:
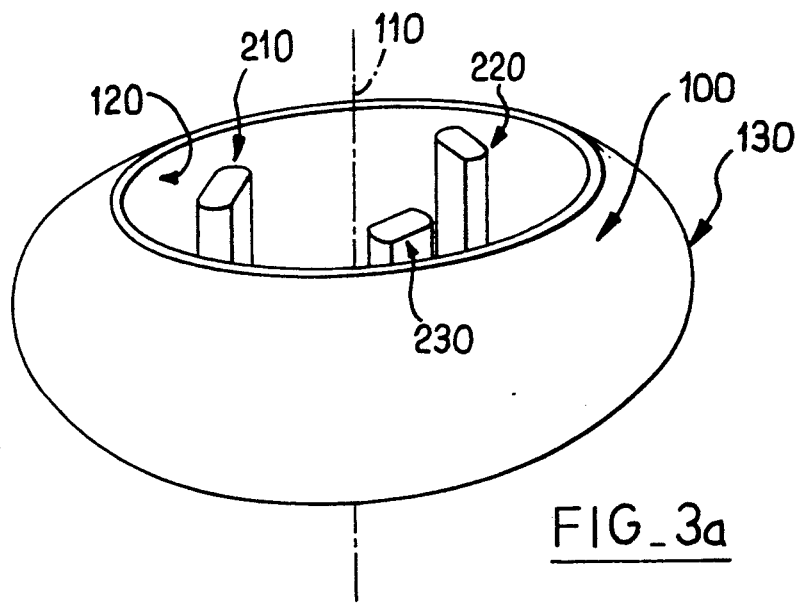
FIG. 3a is a view in three dimensions of a lens according to the present invention.

More precisely, in the embodiment shown in FIGS. 2 and 3, the lens 100 is delimited by an inside surface 120 and by an outside surface 130.

The inside surface 120 is in the form of a circular cylinder above the axis 110. I.e., the inside surface 120 is delimited by a generator line parallel to the axis 110 and rotated thereabout.

The outside surface 130 is generated by rotating a non-spherical generator curve about the axis 110. Three cells 210, 220, and 230 are preferably provided inside the inside surface 120 at regular 120° intervals about the axis 110, as shown in FIG. 2, or else four equivalent photosensitive cells 210, 220, 230, 240 are provided uniformly spaced at 90° intervals about the axis 110 as shown in FIG. 2a.

By way of non-limiting example, the photosensitive cells may be of the type BPW46. Such cells have a sensitive area occupying a field of about 3 mm×3 mm.

The toroidal aspherical lens 100 is preferably molded as a single piece of plastic.

In a particular embodiment, the lens 100 is made of molded acrylic. Its refractive index at a wavelength of 0.9 μm is 1.485. The lens 100 is a 360° torus having an outside diameter R1 of about 28 mm in the plane of symmetry of the lens transverse to the axis 110. As shown in FIG. 3, the vertical right section of the lens 100 is plane and elliptical, as described above.

The thickness E of the lens corresponds to the difference between its above-mentioned outside radius R1, and the radius R2 of its inside surface 120, and is about 5 mm.

The height H of the lens 100 parallel to its axis 110 is about 10 mm. Its elliptical outside surface 130 also has the following characteristics: radius of curvature equals 3.6 mm, aspherical parameter equals 0.6, and useful height relative to the axis equals 5 mm. The resulting focal length of such a lens is about 7.4227 mm.

The cells 210, 220, and 230 shown diagrammatically in FIG. 2 have their respective photosensitive surfaces situated in the plane of minimum diffusion at a distance D=4 mm from the inside surface 120 of the lens.

In FIG. 2, reference 300 designates an aiming axis perpendicular to the sensitive surface 211 of cell 210. This aiming axis 300 which is horizontal in use occupies the plane of symmetry of the lens 100 that is perpendicular to the axis 110.

In FIG. 2, references 310 and 312 show two other light rays having a horizontal incidence of 45° relative to the above-mentioned aiming axis 300. That is to say that the two light rays 310 and 312 are contained in the horizontal plane of symmetry of the lens 100 perpendicular to the vertical axis 110, but their incidence is at an angle of 45° relative to the aiming axis 300. Ray 310 strikes the center A of the photosensitive surface 211 of cell 210. Ray 312 passes through the center of the lens, i.e. through the point where the vertical axis 110 intercepts the horizontal theoretical aiming axis 300. Consequently, ray 312 is not deflected as it goes through the lens 100. Ray 312 intercepts the focusing plane 320 which contains the photosensitive surface 211 at a point B. The points A and B are marked on the spot diagrams of FIGS. 4 to 9.

FIG. 3 shows a beam having a central ray at an angle of incidence of 10° relative to the plane of symmetry 140 of the lens which extends transversely to the axis 110.

The spot diagrams of FIGS. 4 to 9 were made as follows.

The focusing plane was situated at 4 mm from the inside surface 120 of the toroidal aspherical lens. A 10×20 mm rectangular pupil was used.

In FIGS. 4 to 9, the vertical axis of the spot diagrams is referenced VA while the horizontal axis of the spot diagrams is referenced HA.

FIG. 4 corresponds to a beam having an azimuth incidence H and a zenith incidence V that are both zero, i.e. a beam coinciding with the aiming axis 300.

FIG. 5 corresponds to a beam having an azimuth incidence H which is zero and a zenith incidence V of 10°, i.e. a beam contained in a vertical plane including the axis 110 but with the beam sloping at 10° relative to the aiming axis 300.

FIG. 6 corresponds to a beam having an azimuth incidence H of 30° and a zenith incidence V of 0°, i.e. a beam contained in the plane of symmetry 140 of the lens extending transversely to the axis 110, with the beam inclined at 30° relative to the aiming axis 300.

FIG. 7 corresponds to a beam having an azimuth incidence H of 30° and a zenith incidence V of 10°.

Figure 8:
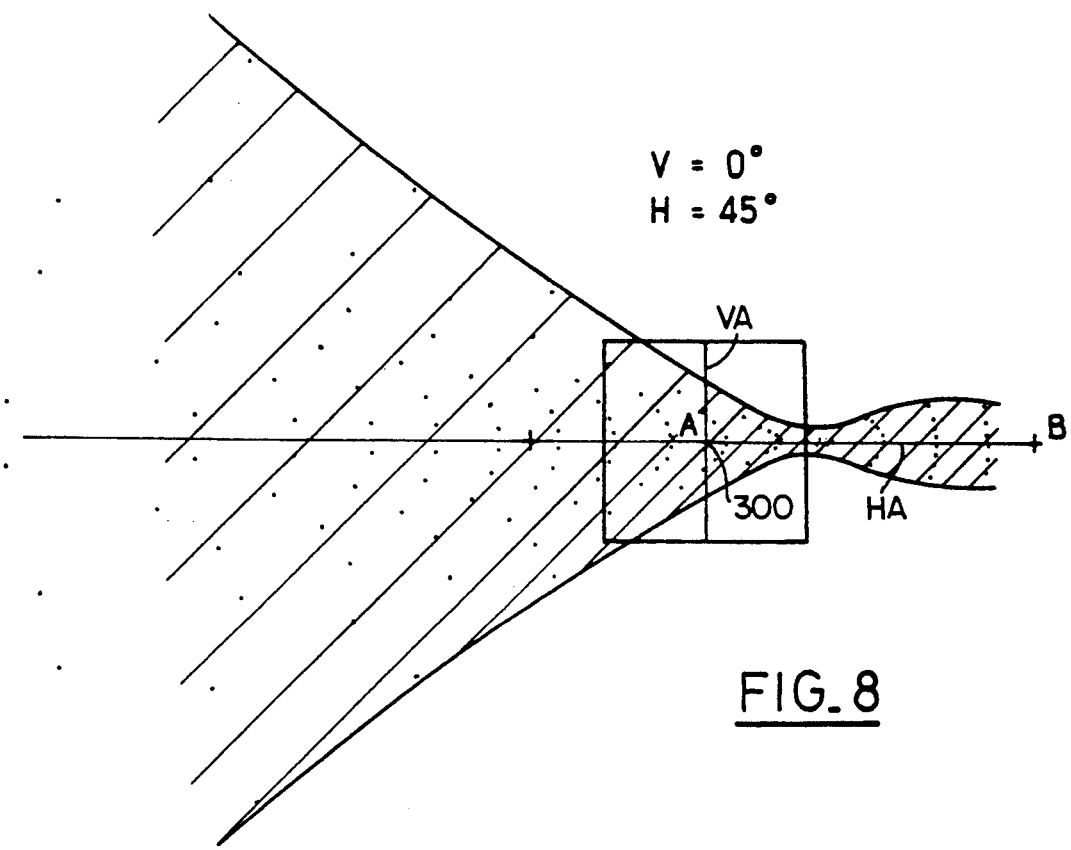

FIG. 8 corresponds to a beam having an azimuth incidence H of 45° and a zenith incidence V of 0°.

Figure 9:
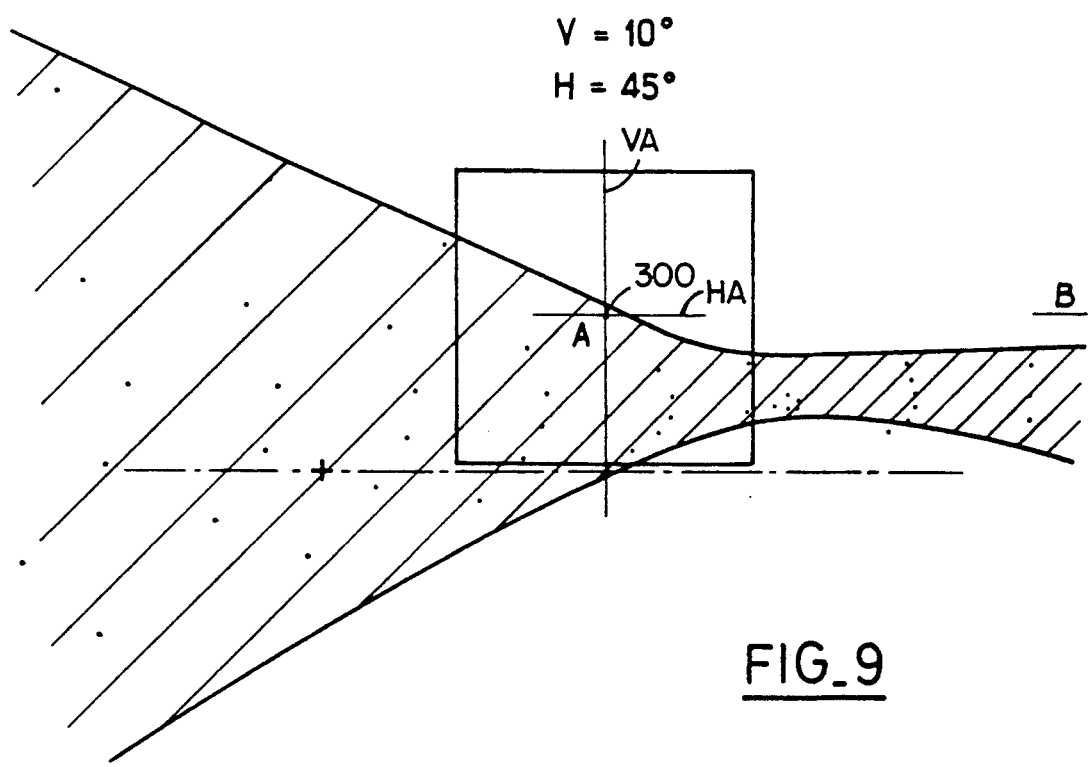

Finally, FIG. 9 corresponds to a beam having an azimuth incidence H of 45° and a zenith incidence V of 10°.

FIGS. 4 and 5 show substantially no light loss. The same applies to FIG. 6. Light loss is very low in FIG. 7. Light loss is zero in FIG. 8, and is very low in FIG. 9.

The diagrams of FIGS. 4 to 9 show that the toroidal aspherical lens 100 serves to recover substantially all of the incident light flux from up to at least 45° from the axis and apply it to the photosensitive cell 200.

Naturally, the invention is not limited to the particular embodiments described above but extends to any variant coming within its spirit.

For example, as shown in accompanying FIG. 10, the toroidal aspherical lens 100 may be solid. Its outside surface 130 may continue to comply with the above-mentioned characteristics. However, the block centered on the axis 110 then has a plurality of slots 150 uniformly distributed about the axis 110 for receiving the photosensitive cells 210, 220, and 230. These slots open out to one of the faces 160 of the lens extending transversely to the axis 110. This face 160 is adjacent to a plate 400 which serves as a support for the photosensitive cells. The photosensitive cells are thus slid into the slots 150. The slots 150 may be made so that they are exactly complementary to the outside shape of the photosensitive cells 210, 220, and 230.

Slots 150 may also be provided which are larger in section than the photosensitive cells 210, 220, and 230, with the cells being fixed in the slots 150 by means of a settable resin or by means of a silicone oil which preferably has a refractive index very close to that of the lens 100.

By making the lens 100 in the form of a solid toroidal aspherical lens, it is possible to ensure that the photosensitive cells 210, 220, and 230 are positioned accurately, automatically and reliably.

In another variant, shown diagrammatically in FIG. 11, the toroidal aspherical lens 100 may be constituted by an assembly of various concentric parts, e.g. two concentric parts 170 and 180 which are diagrammatically represented in FIG. 11, which parts are made of different plastics.

For example one may be made of polystyrene and the other of polymethylmethacrylate.

By using a lens built up from different concentric parts made of different materials, it is possible to correct various aberrations in a manner which is known per se.

I claim:

1. A remote control system, in particular for locking and unlocking the doors of a motor vehicle, the system being of the type comprising a portable transmitter including means constituting a light source suitable for generating an encoded light flux, and a fixed receiver including photosensitive means designed to receive the light flux and associated with treatment means designed to decode said light flux, wherein the photosensitive means of the receiver comprise an annular lens having a toroidal aspherical outside surface in the form of a revolution toroidal aspherical surface covering 360° about a vertical axis, and a plurality of photocells provided inside said revolution toroidal aspherical surface of said annular lens and uniformly spaced about said vertical axis.

2. A remote control system according to claim 1, wherein the receiver includes three photocells uniformly spaced apart at 120° intervals.

3. A remote control system according to claim 1, wherein the receiver includes four photocells uniformly spaced apart at 90° intervals.

4. A remote control system according to claim 1, wherein the lens is delimited by an inside surface in the form of a circular cylinder about said vertical axis and by said toroidal aspherical outside surface, thereby constituting a body of revolution about said vertical axis.

5. A remote control system according to claim 1, wherein the lens having said toroidal aspherical outside surface is solid and is provided with a plurality of slots designed to receive the photosensitive cells, said slots opening out into a lateral face of the lens extending transversely to said vertical axis.

6. A remote control system according to claim 1, wherein the toroidal aspherical lens is made by molding plastic.

7. A remote control system according to claim 1, wherein the toroidal aspherical lens is made of acrylic.

8. A remote control system according to claim 1, wherein the toroidal aspherical outside surface of the lens has a radius of curvature of about 3.6 mm and an aspherical parameter of about −0.6.

9. A remote control system according to claim 1, wherein the lens is made up of a plurality of concentric parts.

10. A remote control system according to claim 1, wherein the lens is made up of two concentric parts made respectively of polystyrene and of polymethylmethacrylate.

* * * * *